United States Patent
Ebihara et al.

(10) Patent No.: US 12,200,389 B2
(45) Date of Patent: Jan. 14, 2025

(54) ADAPTIVE CORRELATED MULTIPLE SAMPLING

(71) Applicant: OMNIVISION TECHNOLOGIES, INC., Santa Clara, CA (US)

(72) Inventors: Hiroaki Ebihara, San Jose, CA (US); Jiayu Guo, Milpitas, CA (US); Liang Zuo, Milpitas, CA (US); Lihang Fan, Sunnyvale, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 93 days.

(21) Appl. No.: 18/322,408

(22) Filed: May 23, 2023

(65) Prior Publication Data

US 2024/0397236 A1  Nov. 28, 2024

(51) Int. Cl.
| | |
|---|---|
| *H04N 25/78* | (2023.01) |
| *H03K 3/037* | (2006.01) |
| *H03K 5/22* | (2006.01) |
| *H03K 5/24* | (2006.01) |
| *H03K 19/20* | (2006.01) |
| *H04N 25/616* | (2023.01) |

(52) U.S. Cl.
CPC ........... *H04N 25/78* (2023.01); *H04N 25/616* (2023.01); *H03K 3/037* (2013.01); *H03K 5/22* (2013.01); *H03K 19/20* (2013.01)

(58) Field of Classification Search
CPC ...... H04N 25/78; H04N 25/616; H03K 3/037; H03K 5/22; H03K 19/20; H03K 5/2481; H03M 1/56
See application file for complete search history.

(56) References Cited

U.S. PATENT DOCUMENTS

| | | | |
|---|---|---|---|
| 11,206,039 B1 * | 12/2021 | Ebihara | H03M 1/56 |
| 11,431,936 B2 | 8/2022 | Fan et al. | |
| 11,659,302 B1 * | 5/2023 | Tsai | H03M 1/56 |
| 11,770,634 B1 * | 9/2023 | Tian | H03K 4/50 |
| 2021/0329185 A1 * | 10/2021 | Fan | H03M 1/56 |
| 2022/0269482 A1 | 8/2022 | Fan et al. | |
| 2024/0098376 A1 * | 3/2024 | Fan | H04M 1/123 |
| 2024/0129650 A1 * | 4/2024 | Wang | H04N 25/78 |

OTHER PUBLICATIONS

U.S. Appl. No. 17/934,196, filed Sep. 21, 2022, Fan et al.
U.S. Appl. No. 18/047,588, filed Oct. 18, 2022, Wang.

* cited by examiner

*Primary Examiner* — Marly S Camargo
(74) *Attorney, Agent, or Firm* — PERKINS COIE LLP

(57) ABSTRACT

A readout circuit includes a comparator having a first input coupled to receive a ramp signal from a ramp generator and a second input coupled to receive an analog image data signal from one of a plurality of bitlines. The comparator is configured to generate a comparator output in response to a comparison of the ramp signal and the analog image data signal. A sampling circuit has a first input coupled to receive a sampling control signal and a second input coupled to receive the comparator output. The sampling circuit is configured to generate a sampling output. A counter has a first input coupled to receive a counter control signal and a second input coupled to receive one of the comparator output and a signal from the sampling circuit. The readout circuit is configured to perform correlated multiple sampling (CMS) calculations or non-CMS calculations in response to the sampling output.

25 Claims, 9 Drawing Sheets

ADAPTIVE CORRELATED MULTIPLE SAMPLING

TECHNICAL FIELD

This disclosure relates generally to image sensors, and in particular but not exclusively, relates to high dynamic range (HDR) complementary metal oxide semiconductor (CMOS) image sensors.

BACKGROUND

Image sensors have become ubiquitous and are now widely used in digital cameras, cellular phones, security cameras, as well as in medical, automotive, and other applications. As image sensors are integrated into a broader range of electronic devices, it is desirable to enhance their functionality, performance metrics, and the like in as many ways as possible (e.g., resolution, power consumption, dynamic range) through both device architecture design as well as image acquisition processing. The technology used to manufacture image sensors has continued to advance at a great pace. For example, the demands of higher resolution and lower power consumption have encouraged the further miniaturization and integration of these devices.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (e.g., image data) representing the external scene. The analog image signals on the bitlines are coupled to readout circuits, which include input stages having analog-to-digital conversion (ADC) circuits to convert those analog image signals from the pixel array into the digital image signals.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

Figure 1:
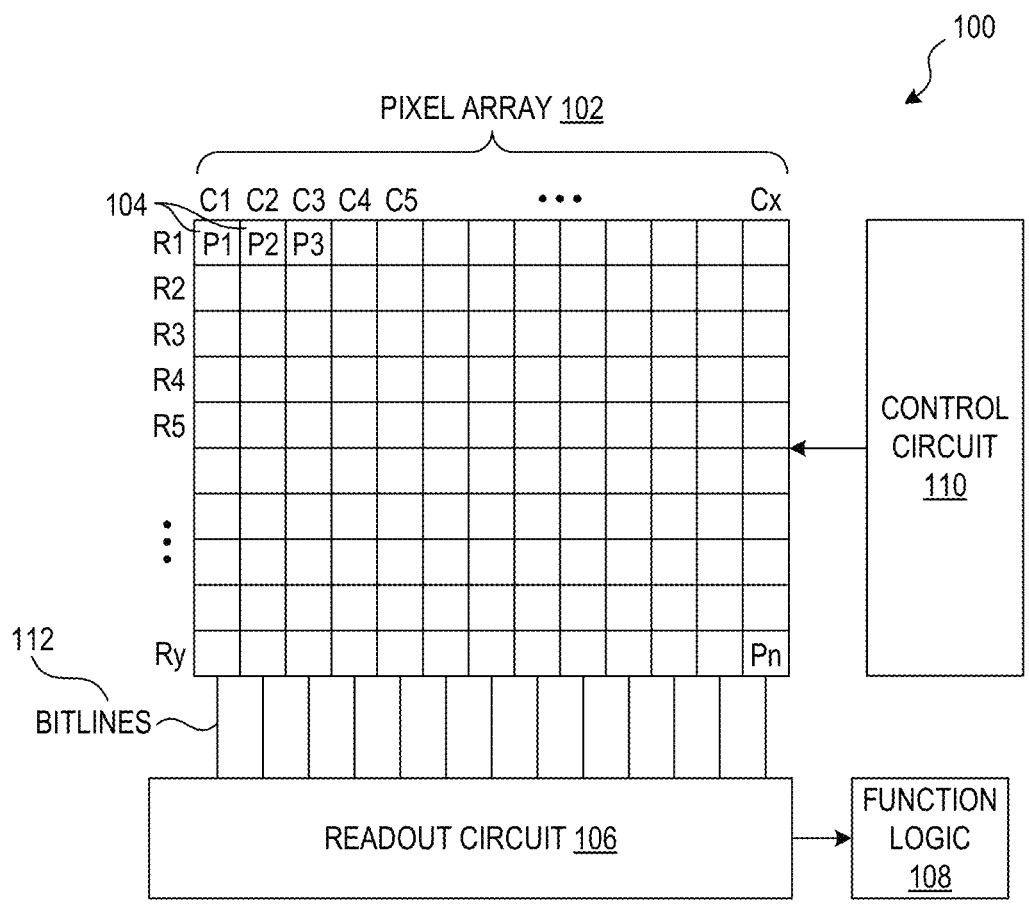
FIG. 1 illustrates one example of an imaging system including a pixel array in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. In addition, common but well-understood elements that are useful or necessary in a commercially feasible embodiment are often not depicted in order to facilitate a less obstructed view of these various embodiments of the present disclosure.

DETAILED DESCRIPTION

Examples directed to an imaging system with a pixel cell readout circuit for performing adaptive correlated multiple sampling (CMS) and providing reduced readout periods are disclosed. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present disclosure. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper." "top." "bottom," "left," "right." "center," "middle," and the like, may be used herein for case of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with a pixel cell readout circuit for performing adaptive CMS and providing reduced readout periods are disclosed. CMS is a technique used to reduce the noise in analog-to-digital conversion (ADC) circuits by averaging out correlated noise sources. CMS involves sampling the same analog signal multiple times at different times and correlating the samples to reduce the noise, particularly those of high frequency. One of the benefits of CMS is reduced readout noise. In dark conditions when the signal is small, random noise from components of the readout circuit dominate, so using CMS can be advantageous. However, in bright conditions when the signal is large, photon shot noise dominates, so using CMS may not improve the signal-to-noise ratio (SNR). CMS also may not be effective in reducing low frequency noise, such as 1/f noise and random telegraph signals (RTS). Moreover, using CMS is associated with costs such as increased readout time and reduced frame rates.

In various examples, a readout circuit determines whether a signal is small or large based on a comparator output. In various examples, CMS calculations are performed if the signal is determined to be small and non-CMS calculations are performed if the signal is determined to be large. Adapting the calculations performed based on the signal size preserves the benefits of using CMS while reducing readout periods.

In various examples of the present disclosure, a readout circuit includes a comparator having a first input coupled to receive a ramp signal from a ramp generator and a second input coupled to receive an analog image data signal from one of a plurality of bitlines. The comparator is configured to generate a comparator output in response to a comparison of the ramp signal and the analog image data signal. The readout circuit also includes a sampling circuit having a first input coupled to receive a sampling control signal and a second input coupled to receive the comparator output. The sampling circuit is configured to generate a sampling output. The readout circuit further includes a counter having a first input coupled to receive a counter control signal and a second input coupled to receive one of the comparator output and a signal from the sampling circuit. The counter is configured to generate a count code. The readout circuit is configured to perform correlated multiple sampling (CMS) calculations or non-CMS calculations in response to the sampling output.

To illustrate, FIG. 1 shows one example of an imaging system 100 having a readout circuit 106 in accordance with the teachings of the present disclosure. In particular, the example depicted in FIG. 1 illustrates an imaging system 100 that includes a pixel array 102, bitlines 112, a control circuit 110, a readout circuit 106, and function logic 108. In one example, pixel array 102 is a two-dimensional (2D) array including a plurality of pixel circuits 104 (e.g., P1, P2 . . . . Pn) that are arranged into rows (e.g., R1 to Ry) and columns (e.g., C1 to Cx) to acquire image data of a person, place, object, etc., which can then be used to render an image of a person, place, object, etc.

In various examples, the readout circuit 106 may be configured to read out the image signals through the column bitlines 112. As will be discussed, in the various examples, readout circuit 106 may include an analog-to-digital converter (ADC) in accordance with the teachings of the present disclosure. In the example, the digital image data values generated by the analog to digital converters in readout circuit 106 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuit 110 is coupled to pixel array 102 to control operation of the plurality of photodiodes in pixel array 102. For example, control circuit 110 may generate a rolling shutter or a global shutter signal for controlling image acquisition. In other examples, image acquisition is synchronized with lighting effects such as a flash.

In one example, imaging system 100 may be included in a digital, cell phone, laptop computer, an endoscope, a security camera, or an imaging device for automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2A:
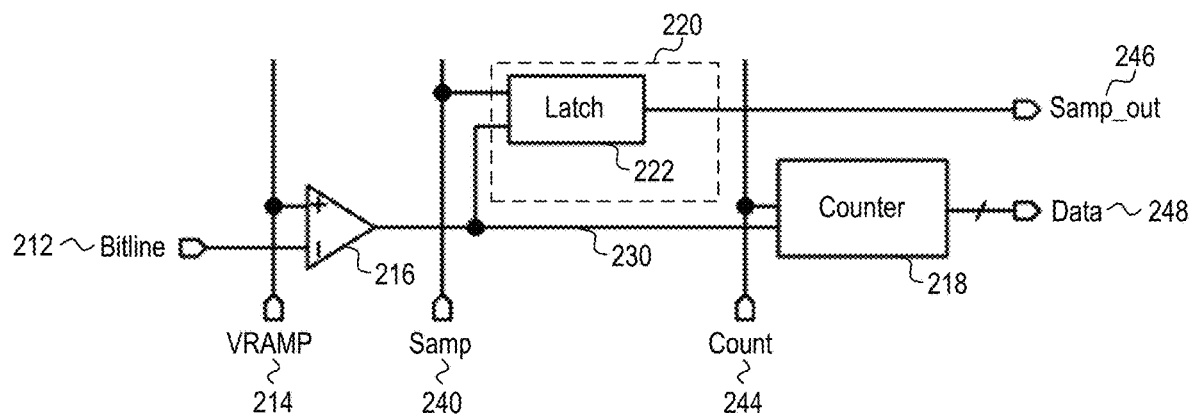
FIGS. 2A and 2B illustrate schematics of two examples of a readout circuit in accordance with the teachings of the present disclosure.
Figure 2B:
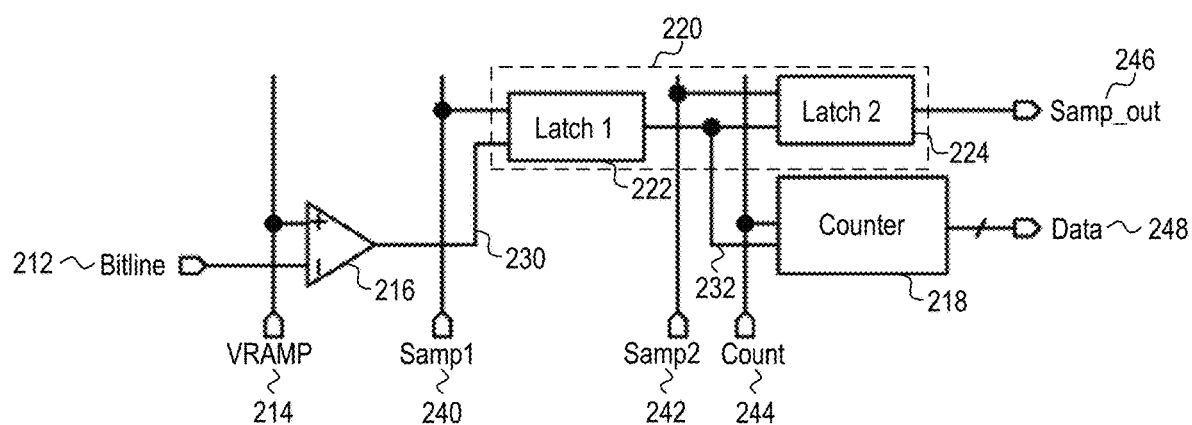

FIGS. 2A and 2B illustrate schematics of two examples of a readout circuit 206 in accordance with the teachings of the present disclosure. It is appreciated that the readout circuit 206 of FIGS. 2A and 2B may be an example of the readout circuit 106 included in the imaging system 100 as shown in FIG. 1, and that similarly named and numbered elements described above are coupled and function similarly below.

Referring to both FIGS. 2A and 2B, the readout circuit 206 includes a comparator 216 with a first input coupled to receive a ramp signal VRAMP 214 from a ramp generator and a second input coupled to receive an analog image data signal from one of a plurality of bitlines 212. The comparator 216 is configured to generate a comparator output 230 in response to a comparison of the ramp signal VRAMP 214 and the analog image data signal from the bitline 212. A sampling circuit 220 has a first input coupled to receive a sampling control signal Samp (or Samp1) 240 and a second input coupled to receive the comparator output 230. The sampling circuit 220 is configured to generate a sampling output Samp_out 246. A counter 218 has a first input coupled to receive a counter control signal Count 244 and is configured to generate count code Data 248.

In FIG. 2A, the sampling circuit 220 includes a latch 222 with a first input coupled to receive Samp 240 and a second input coupled to receive the comparator output 230. The latch 222 is configured to generate the sampling output 246. The counter 218 has a second input coupled to receive the comparator output 230.

In FIG. 2B, the sampling circuit 220 includes a first latch 222 and a second latch 224. The first latch 222 has a first input coupled to receive a first sampling control signal Samp1 240 and a second input coupled to receive the comparator output 230. The first latch 222 is configured to generate a latch output 232. The second latch 224 has a first input coupled to receive a second sampling control signal Samp2 242 and a second input coupled to receive the latch output 232. The second latch 224 is configured to generate the sampling output 246. The counter 218 has a second input coupled to receive the latch output 232.

Each of the latches 222 and 224 are configured to latch (i.e., retain) the value of the second input in response to the first input. For example, in FIG. 2A, the sampling output 246 is equal to the comparator output 230 while Samp 240 is high. In response to a falling edge of Samp 240, the latch 222 latches the comparator output 230 and remains equal to that value even after the falling edge of Samp 240 (i.e., when Samp 240 is low). In FIG. 2B, the sampling output 246 is equal to the latch output 232 while Samp2 242 is high. In response to a falling edge of Samp2 242, the second latch 224 latches the latch output 232 and remains equal to that value even after the falling edge of Samp2 242 (i.e., when Samp2 242 is low). The latch output 232 is equal to the comparator output 230 while Samp1 240 is high. In response to a falling edge of Samp1 240, the first latch 222 latches the comparator output 230 and remains equal to that value even after the falling edge of Samp1 240 (i.e., when Samp1 240 is low). As will be described in further detail with respect to FIG. 3B below, in various examples, the second latch 224 may not be necessary depending on the timing of the ramp signal VRAMP 214.

Figure 3A:
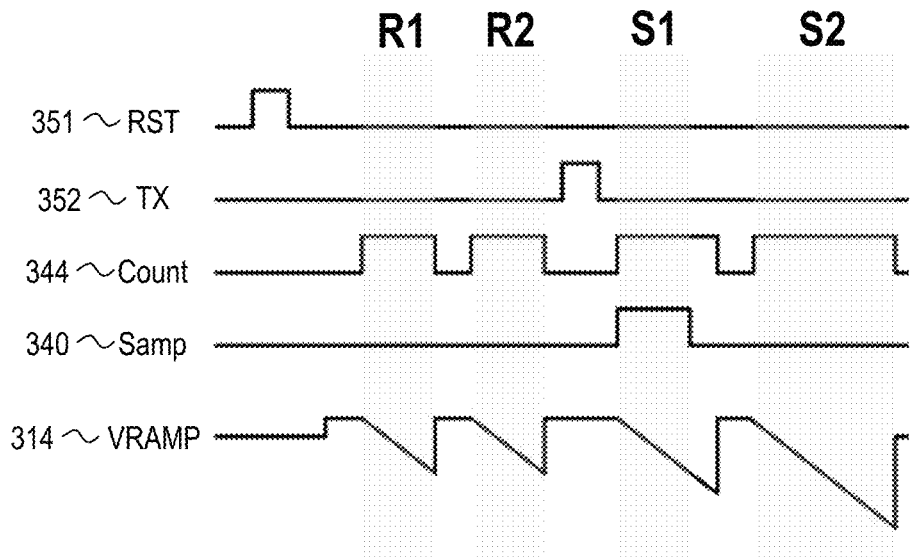
FIGS. 3A and 3B illustrate readout period timing diagrams of example readout circuits in accordance with the teachings of the present disclosure.
Figure 3B:
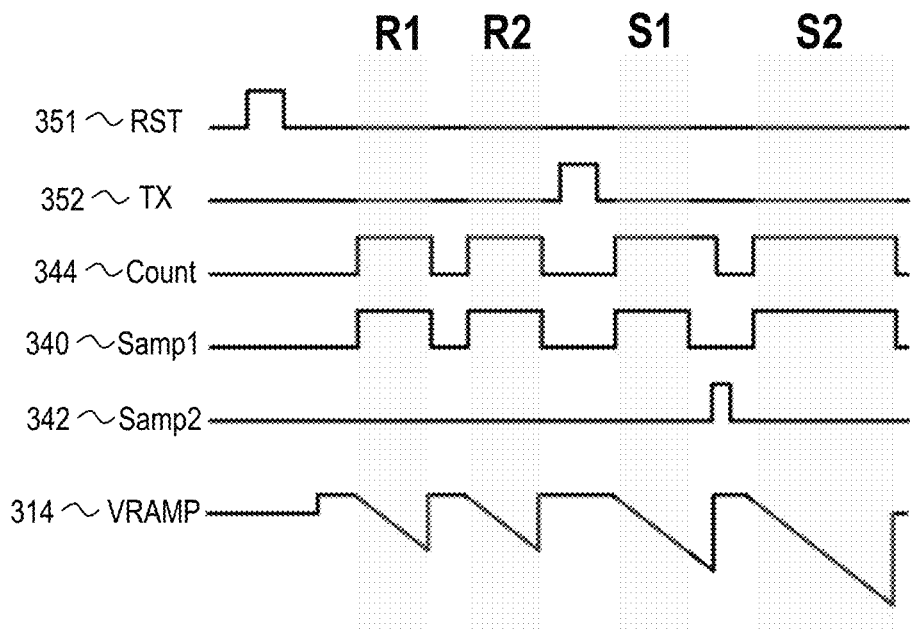

FIGS. 3A and 3B illustrate readout period timing diagrams of example readout circuits in accordance with the teachings of the present disclosure. It is appreciated that the timing diagrams of FIGS. 3A and 3B may be example timing diagrams of the readout circuits 206 as shown in FIGS. 2A and 2B, and that similarly named and numbered elements described above are coupled and function similarly below.

Referring to both FIGS. 3A and 3B, the readout period includes reading out two pairs (m=2) of reset signals R1, R2 and image signals S1, S2. In other embodiments, a greater number of pairs can be read out (e.g., m=4). Before the signals are readout, a reset signal RST 351 is pulsed to reset the pixel cell being read out. During the readouts of the reset signals R1, R2 and the image signals S1, S2, a counter control signal Count 344 remains on and a ramp signal VRAMP 314 is ramped. Between the last reset signal readout R2 and the first image signal readout S1, a transfer transistor TX 352 coupled to a photodiode is pulsed to transfer the image charges to a floating diffusion and to a comparator (e.g., the comparator 216 illustrated in FIGS. 2A and 2B).

In FIG. 3A, a sampling control signal Samp 340 is turned on only during the first image signal readout S1. In the illustrated example, the falling edge of the sampling control signal Samp 340 occurs before the falling edge of the counter control signal Count 344 during the first image signal readout S1 because there may be a timing gap between the latch (e.g., the latch 222) and the counter (e.g., the counter 218). The falling edge of Samp 340 occurring before falling edge of Count 344 ensures that the count code is accurate at the falling edge of Samp 340. In various examples, Count 344 turns off at the end of the first image signal readout S1 with Samp 340.

In FIG. 3B, a first sampling control signal Samp1 340 is turned on during all signal readouts R1, R2, S1, S2. In the illustrated example, the falling edge of the first sampling control signal Samp1 340 occurs before falling edge of the counter control signal Count 344 during the first image signal readout S1 for the reasons aforementioned with respect to FIG. 3A. In various examples, Count 344 turns off at the end of the first image signal readout S1 with Samp1 340. A second sampling control signal Samp2 342 is pulsed between the first and second image signal readouts S1, S2.

Referring back to both FIGS. 3A and 3B, VRAMP 314 during the first image signal readout S1 is shorter than during the second, or last, image signal readout S2. This is because the first image signal S1 is used as a test case to determine whether the image signal is small or large. If the image signal is small, the bitline signal will intersect the relatively short VRAMP 314 during S1, causing the comparator to flip. The sampling output will latch the flipped comparator output to indicate to a subsequent circuit that the image signal is small and that CMS should be performed (e.g., use both image signal readouts S1 and S2). If the image signal is large, the bitline signal will fail to intersect the relatively short VRAMP 314 during S1. The sampling output will latch the non-flipped comparator output to indicate to a subsequent circuit that the image signal is large and that CMS should not be performed (i.e., discard the first image signal readout S1, which is inaccurate due to insufficient comparator range, and only use the second image signal readout S2).

Using the first image signal S1 as a test case provides the benefit of shortening the readout period. In conventional imaging systems using CMS for all readouts regardless of the signal size, VRAMP 314 during S1 is as long as VRAMP 314 during S2 because there cannot be comparator range issues for any of the image signals read out. In embodiments in accordance with the teachings of the present disclosure, however, VRAMP 314 during S1 can be shorter than VRAMP 314 during S2 by a value dependent on what the desired threshold between small and large signals is.

For example, if the resolution of the output signal is 10-bit, the ADC count for the second image signal S2 must be greater than the ADC counts for the first and/or second reset signals R1, R2 by approximately $2^{10}$ counts. However, the ADC count for the first image signal S1 can be nearly the same as the ADC counts for the smaller reset signals R1, R2. Thus, if the ADC count for S1 is reduced to 32 counts, the ADC count code for S1 is reduced by $2^{10}-32=992$ counts compared to conventional imaging systems. If the counting frequency is 1.8 GHZ, the S1 readout period can be shortened by 551 ns per frame. Furthermore, the ramp settling time after S1 can also be reduced due to the smaller voltage swing. For example, the ramp settling time can be reduced by 130 ns per readout period, so the total readout period can be reduced by about 680 ns. Compared to a conventional imaging system using CMS, an imaging system with a 10-bit resolution using adaptive CMS in accordance with embodiments of the present technology yields a reduction in the readout period by approximately 10%. The reduction in the readout period increases as the number of CMS sample pairs and/or the ADC resolution increases. For example, an imaging system with a 12-bit resolution using adaptive CMS in accordance with embodiments of the present technology yields a reduction in the readout period by approximately 20%.

In other embodiments, VRAMP 314 during the first image signal readout S1 is longer than the second, or subsequent, image signal readout S2. The second image signal readout S2 (and any and all subsequent image signal readouts) is used as the test case to determine whether the image signal is small or large. While having a longer initial ramp can cause minor degradation on noise performance of the second (and subsequent) image signal readout, a simpler circuit implementation and circuit control can be used. For example, a second latch (e.g., the second latch 224 illustrated in FIG. 2) may not be necessary and a single latch (e.g., the first latch 222) may be sufficient to determine whether the signal is small or large after the second, or subsequent, image signal readouts (i.e., test cases).

Figure 4:
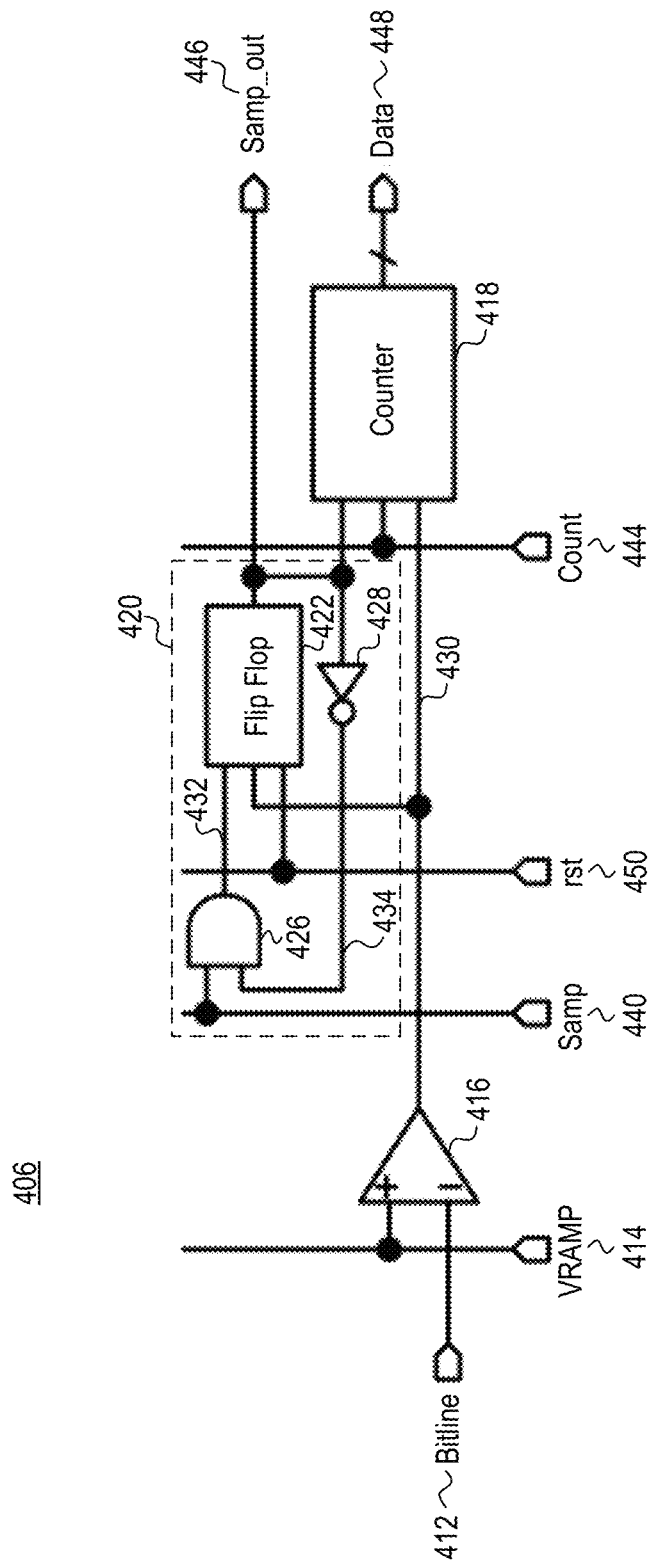
FIG. 4 illustrates a schematic of another example of a readout circuit in accordance with the teachings of the present disclosure.

FIG. 4 illustrates a schematic of another example of a readout circuit 406 in accordance with the teachings of the present disclosure. It is appreciated that the readout circuit 406 of FIG. 4 may be an example of the readout circuit 106 included in the imaging system 100 as shown in FIG. 1, and that similarly named and numbered elements described above are coupled and function similarly below.

The readout circuit 406 includes a comparator 416 with a first input coupled to receive a ramp signal VRAMP 414 from a ramp generator and a second input coupled to receive an analog image data signal from one of a plurality of bitlines 412. The comparator 416 is configured to generate a comparator output 430 in response to a comparison of the ramp signal VRAMP 414 and the analog image data signal from the bitline 412. A sampling circuit 420 has a first input coupled to receive a sampling control signal Samp 440 and a second input coupled to receive the comparator output 430. The sampling circuit 420 is configured to generate a sampling output Samp_out 446. A counter 418 has a first input coupled to receive a counter control signal Count 444, a second input coupled to receive Samp_out 446, and a third input coupled to receive the comparator output 430. The counter 418 is configured to generate count code Data 448.

The sampling circuit 420 includes an AND gate 426 with a first input coupled to receive the sampling control signal 440 and configured to generate an AND gate output 432. The sampling circuit 420 also includes a flip flop 422 with a first input coupled to receive the AND gate output 432, a second input coupled to receive the comparator output 430, and a third input coupled to receive a flip flop reset signal rst 450. The flip flop 422 is configured to generate the sampling output 446. The sampling circuit 420 further includes an inverter 428 coupled to receive the sampling output 446 and configured to generate an inverter output 434, which is coupled to a second input of the AND gate 426.

The sampling output 446 is equal to the comparator output 430 while the AND gate 428 output is high. In response to a falling edge of Samp 440, the flip flop 422 latches the comparator output 430 and remains equal to that value even after the falling edge of Samp 440 (i.e., when Samp 440 is low). Due to the inverter 428, once the flip flop 422 generates a high value for Samp_out 446, the AND gate output 432 is a low value and the flip flop 422 therefore continues to generate the high value regardless of Samp 440 and the comparator output 430 in subsequent readouts until rst 450 resets the flip flop 422.

Figure 5:
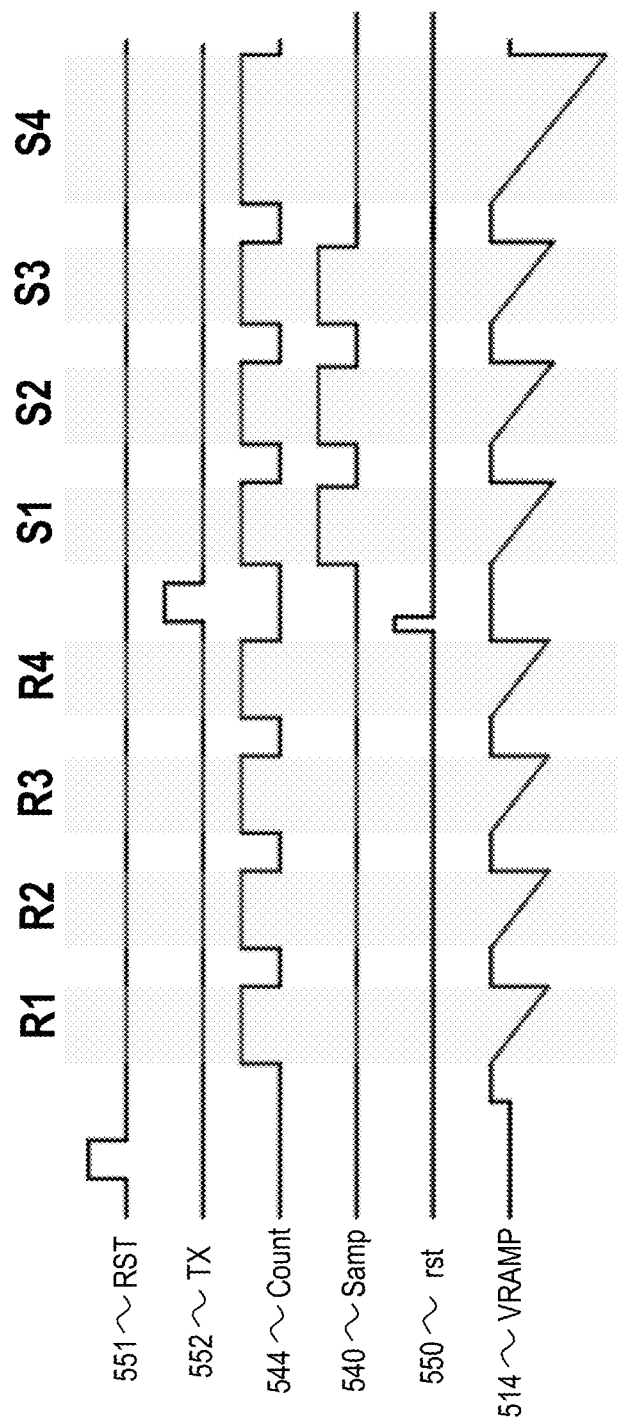
FIG. 5 illustrates a readout period timing diagram of another example readout circuit in accordance with the teachings of the present disclosure.

FIG. 5 illustrates a readout period timing diagram of another example readout circuit in accordance with the teachings of the present disclosure. It is appreciated that the timing diagrams of FIG. 5 may be an example timing diagram of the readout circuits 406 as shown in FIG. 4, and that similarly named and numbered elements described above are coupled and function similarly below.

The readout period includes reading out four pairs (m=4) of reset signals R1, R2, R3, R4 and image signals S1, S2, S3, S4. In other embodiments, a smaller or greater number of pairs can be read out (e.g., m=3, m=8). Before the signals are readout, a reset signal RST 551 is pulsed to reset the pixel cell being read out. During the readouts of the reset signals R1, R2, R3, R4 and the image signals S1, S2, S3, S4, a counter control signal Count 544 remains on and a ramp signal VRAMP 514 is ramped. Between the last reset signal readout R4 and the first image signal readout S1, a transfer transistor TX 552 coupled to a photodiode is pulsed to transfer the image charges to a floating diffusion, which is read out via a bitline to a comparator (e.g., the bitline 412 to comparator 416 illustrated in FIG. 4), and a flip flop reset signal rst 550 is also pulsed.

A sampling control signal Samp 540 is turned on during all image signal readouts except for the last one (i.e., S1, S2, S3). In the illustrated example, the counter control signal Count 544 turns off at the end of each of the first, second, and third image signal readouts S1, S2, S3. In various examples, the falling edges of sampling control signal Samp 540 may occur before the falling edges of counter control signal Count 544 during each of S1, S2, S3 for the reasons aforementioned with respect to FIG. 3A.

The ramp events in VRAMP 514 during S1, S2, S3 are shorter than the ramp event in VRAMP 514 during S4. This is because S1, S2, S3 are used as test cases to determine whether the image signal is small or large. If the image signal is small, the bitline signal will intersect the relatively short VRAMP 514 during S1, causing the comparator to flip. If the image signal is determined to be small in all three test cases, the sampling output will latch the flipped comparator output to indicate to a subsequent circuit that the image signal is small and that CMS should be performed (e.g., use all image signal readouts S1, S2, S3, S4). If the image signal is large, the bitline signal will fail to intersect the relatively short ramp events in VRAMP 514 during S1, S2, S3. If the image signal is determined to be large in at least one of the three test cases, the sampling output will indicate to a subsequent circuit that the image signal is large and that CMS should not be performed (i.e., discard the first, second, and third image signal readouts S1, S2, S3, which may be inaccurate due to insufficient comparator range, and only use the fourth image signal readout S4). An inverter and an AND gate (e.g., the inverter 428 and the AND gate 426 illustrated in FIG. 4) can be used to ensure that the sampling output indicates that the signal is large if any one of the signals during S1, S2, S3 is large.

Using the first, second, and third image signals S1, S2, S3 as test cases provides the benefit of shortening the readout period. In conventional imaging systems using CMS for all readouts regardless of the signal size, VRAMP 514 during S1, S2, S3 are as long as VRAMP 514 during S4 because there cannot be comparator range issues for any of the image signals read out. In embodiments in accordance with the teachings of the present disclosure, however, VRAMP 514 during S1, S2, S3 can be shorter than VRAMP 514 during S4 by a value dependent on what the desired threshold between small and large signals is.

Figure 6:
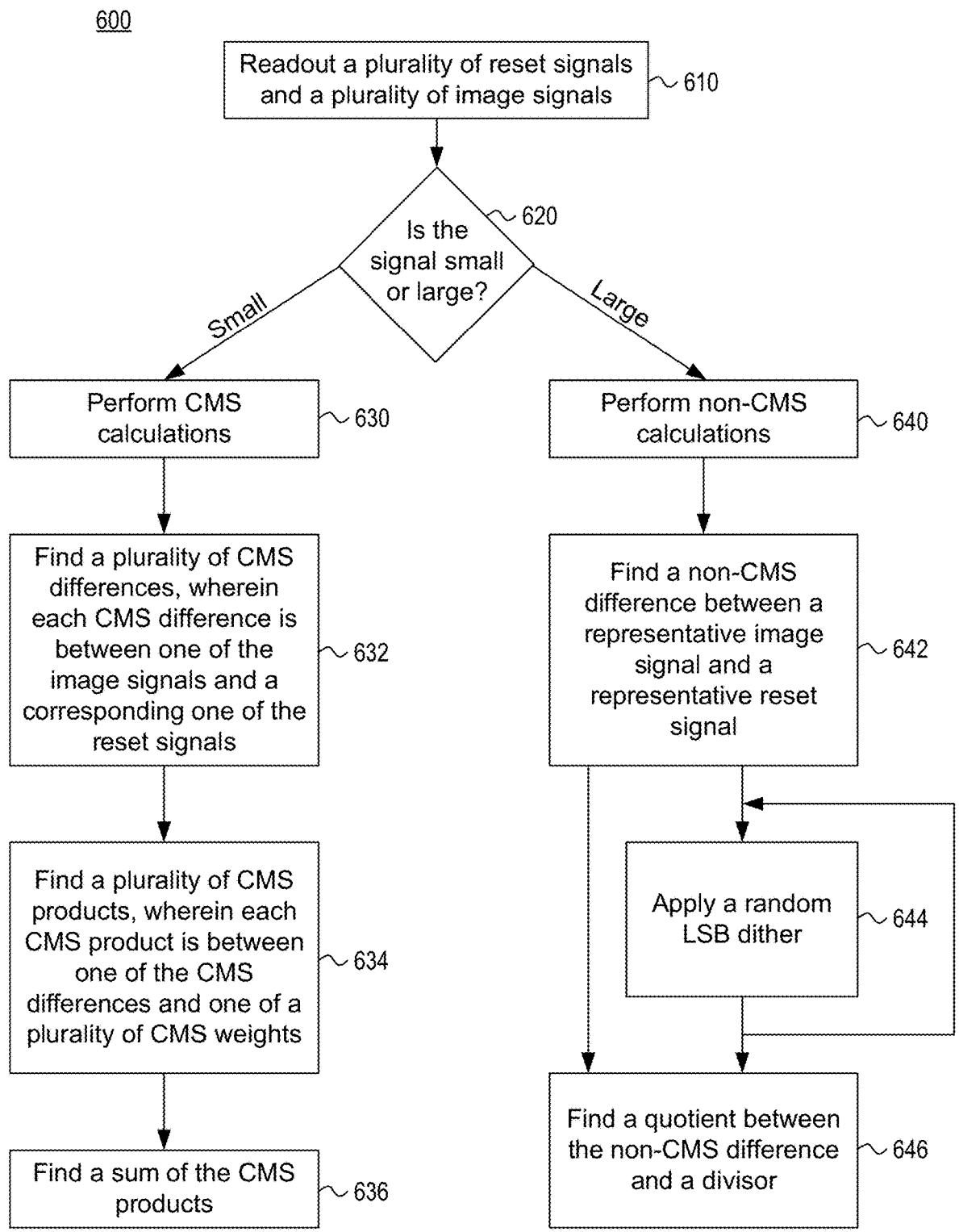
FIG. 6 is a flow diagram illustrating an example method of performing adaptive correlated multiple sampling (CMS) in accordance with the teachings of the present disclosure.

FIG. 6 is a flow diagram illustrating an example method 600 of performing adaptive correlated multiple sampling (CMS) in accordance with the teachings of the present disclosure. It is appreciated that the processing depicted in FIG. 6 may be used in conjunction with the example readout circuits depicted in FIGS. 2A, 2B, and 4, such as readout circuits 206 and 406. In various examples, the method 600 is used to reduce readout periods.

At block 610, a readout circuit (e.g., readout circuits 206 and 406) of an imaging system reads out a plurality of reset signals and a plurality of image signals (e.g., R1, R2, . . . , S1, S2, . . . illustrated in FIGS. 3A, 3B, and 5). At block 620, the readout circuit determines whether the signal is small or large. In various examples, the readout circuits and timing diagrams illustrated in FIGS. 2A-5 are used to carry out block 620. If the image signal is small at block 620, the readout circuit or another circuit (e.g., an arithmetic logic unit (ALU)) of the imaging system ("the circuit") proceeds with performing CMS calculations at block 630. At block 632, the circuit finds a plurality of CMS differences, where each CMS difference is the difference between one of the image signals and a corresponding one of the reset signals. At block 634, the circuit finds a plurality of CMS products, where each CMS product is the product between one of the CMS differences and one of a plurality of weights. At block 636, the circuit finds a sum of the CMS products.

If the image signal is large at block 620, the circuit proceeds with performing non-CMS calculations at block 640. At block 642, the circuit finds a non-CMS difference between a representative image signal and a representative reset signal. The circuit then proceeds to either block 644 or block 646. At block 644, the circuit applies a random least significant bit (LSB) dither. Block 644 can be repeated for a predetermined number of times. At block 646, the circuit finds a quotient between the non-CMS difference and a divisor.

At block 644, a random LSB dither is applied to reduce quantization error, which occurs during ADC. A random noise—in the form of a random increase or decrease in the LSB of the quantized sample by 1—is added to the signal. This random perturbation of the LSB can cause some of the quantization error to be distributed uniformly across the signal, helping to reduce the average quantization noise.

As will be described in further detail below with respect to FIGS. 7 and 10, in other embodiments, the blocks can be performed in different orders, or the final results of the CMS or non-CMS calculations can be arrived at via arithmetic operations in different sequences.

Figure 7:
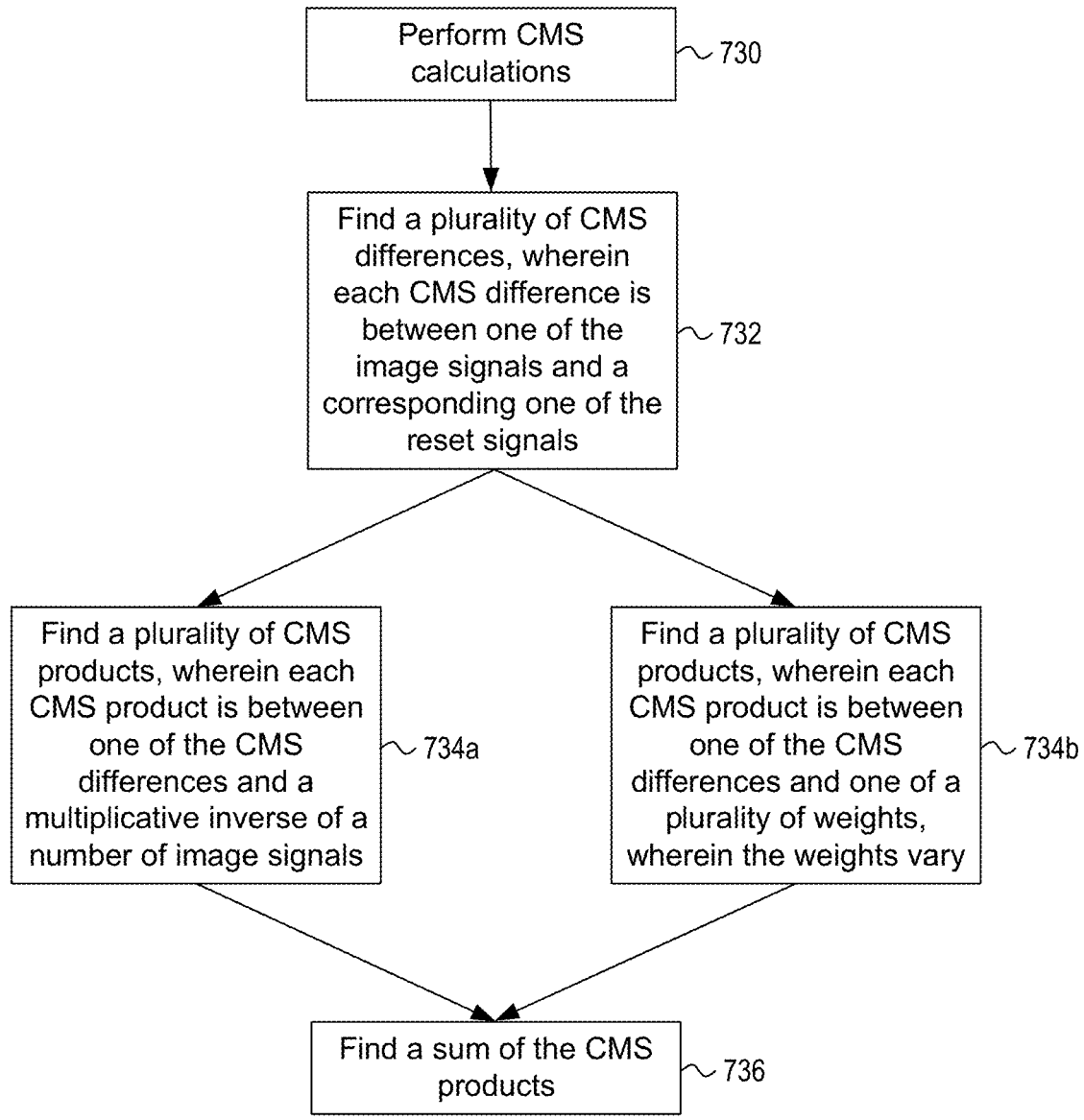
FIG. 7 is a flow diagram illustrating an example method of performing CMS calculations in accordance with the teachings of the present disclosure.

FIG. 7 is a flow diagram illustrating an example method of performing CMS calculations (block 730) in accordance with the teachings of the present disclosure. It is appreciated that the processing depicted in FIG. 7 may be examples of blocks 630, 632, 634, and 636 depicted in FIG. 6.

At block 732, the circuit finds a plurality of CMS differences. For example, if m=4, the CMS differences can be S1−R1, S2−R2, S3−R3, and S4−R4. The circuit can then proceed to either block 734a or 734b, depending on which CMS calculations are preferred. At block 734a, the circuit finds a plurality of CMS products between one of the CMS differences and a multiplicative inverse of the number of image signals. For example, if m=4, the multiplicative inverse of 4 is ¼. At block 736 following block 734a, the circuit finds a sum of the CMS products. For example, if m=4, the sum of the CMS products can be (¼)*(S1−R1)+(¼)*(S2−R2)+(¼)*(S3−R3)+(¼)*(S4−R4), which is simplified as ((S1−R1)+(S2−R2)+(S3−R3)+(S4−R4))/4. In other words, following the path through block 734a yields the difference between the arithmetic average of the image signals and the arithmetic average of the reset signals.

At block 734b, the circuit finds a plurality of CMS products between one of the CMS differences and one of a plurality of weights that add up to 1. For example, if m=4, the plurality of weights can be $a_1$=0.3, $a_2$=0.4, $a_3$=0.1, and $a_4$=0.2. At block 736 following block 734b, the circuit finds a sum of the CMS products. For example, if m=4, the sum of the CMS products can be $a_1$*(S1−R1)+$a_2$*(S2−R2)+$a_3$*(S3−R3)+$a_4$*(S4−R4). In other words, following the path through block 734b yields the difference between the image signals weighted differently and the reset signals weighed differently.

In other embodiments, the CMS calculations can be performed in different arithmetic sequences. For example, the reset signals can be added together one-by-one (e.g., R1, R1+R2, R1+R2+R3, R1+R2+R3+R4), then the sum of the reset signals can be flipped to its negative value (e.g., −(R1+R2+R3+R4)), then the image signals can be added one-by-one (e.g., S1−(R1+R2+R3+R4), S1+S2−(R1+R2+R3+R4), S1+S2+S3−(R1+R2+R3+R4), S1+S2+S3+S4−(R1+R2+R3+R4)), then the result can be divided by the number of image-reset signal pairs (e.g., (S1+S2+S3+S4−(R1+R2+R3+R4))/4).

Figure 8:
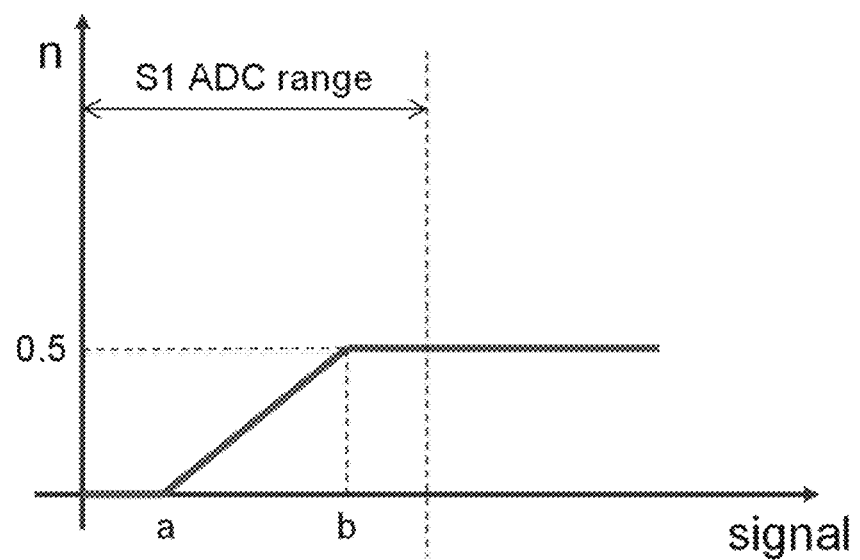
FIG. 8 is a diagram illustrating an example method of performing weighted adaptive CMS in accordance with the teachings of the present disclosure.

FIG. 8 is a diagram illustrating an example method of performing weighted adaptive CMS in accordance with the teachings of the present disclosure. The x-axis represents the signal size and the y-axis represents n, a weight function. In various examples, if m=2, an output of the weighted adaptive CMS can be (S1−R1)*(0.5−n)+(S2−R2)*(0.5+n). When the signal is below a first predetermined threshold a, n=0 so the output is (S1−R1)*0.5+(S2−R2)*0.5, in other words, the difference between the arithmetic average of the image signals and the arithmetic average of the reset signals. When the signal is above a second predetermined threshold b, n=0.5 so the output is S2−R2, in other words, a correlated double sampling (CDS) calculation instead of a CMS calculation. If the signal is between the first and second predetermined thresholds a and b, for example, n=0.25, so the output is (S1−R1)*0.25+(S2−R2)*0.75, in other words, the difference between the image signals weighted differently and the reset signals weighed differently. The weight function n allows the circuit to adaptively perform CMS by applying averaged CMS, weighted CMS, and CDS depending on the size of the signal.

Figure 9:
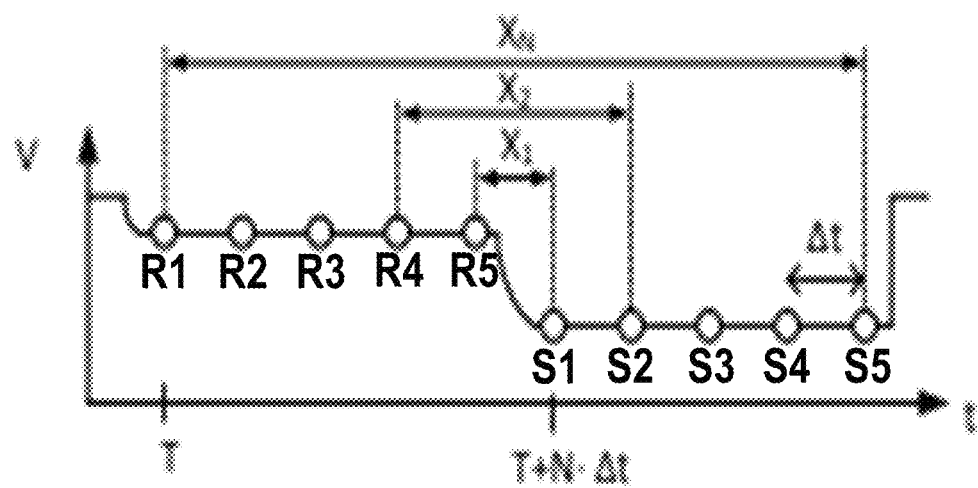
FIG. 9 is a diagram illustrating another example method of performing weighted adaptive CMS in accordance with the teachings of the present disclosure.

FIG. 9 is a diagram illustrating another example method of performing weighted adaptive CMS in accordance with the teachings of the present disclosure. Noise-optimized CMS (NOCMS) provides a mathematical method towards noise optimization by iteratively pairing the image signal and the reset signal that were read out nearest to each other and weighing the pairs that were read out closer together more heavily than the pairs that were read out father from each other (i.e., $X_1$ is weighted more heavily than $X_N$). In the illustrated example, m=5 and the pairs are S1−R5, S2−R4, S3−R3, S4−R2, and S5−R1. In one example, the weights can be assigned such that the output is (S1−R5)*0.4+(S2−R4)*0.3+(S3−R3)*0.2+(S4−R2)*0.075+(S5−R1)*0.025.

Figure 10:
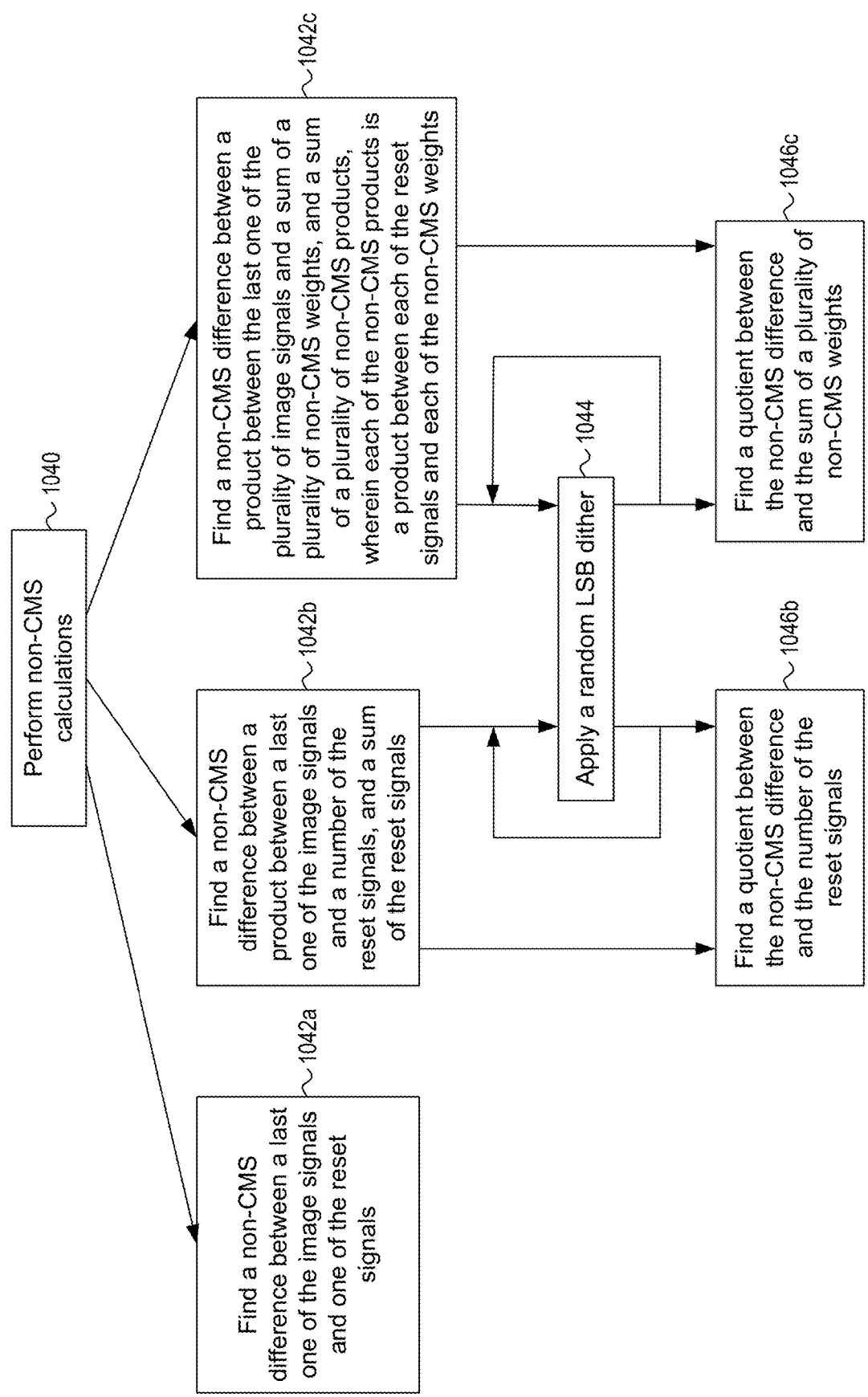
FIG. 10 is a flow diagram illustrating an example method of performing non-CMS calculations in accordance with the teachings of the present disclosure.

FIG. 10 is a flow diagram illustrating an example method of performing non-CMS calculations (block 1040) in accordance with the teachings of the present disclosure. It is appreciated that the processing depicted in FIG. 10 may be examples of blocks 640, 642, 644, and 646 depicted in FIG. 6.

The circuit can proceed with one of blocks 1042a, 1042b, and 1042c. At block 1042a, the circuit finds a non-CMS difference between a last one of the image signals and one of the reset signals. For example, if m=2, the output can be either S2−R2 or S2−R1. If block 646 illustrated in FIG. 6 were applied, the divisor would be 1.

At block 1042b, the circuits finds a non-CMS difference between (1) a product between a last one of the image signals and the number of the reset signals and (2) a sum of the reset signals. The circuit can then either apply a random LSB dither at block 1044 one or more times, or proceed directly to block 1046b in which the circuit finds a quotient between the non-CMS difference and the number of the reset signals. For example, if m=4, the output can be (4*S4−(R1+R2+R3+R4))/4.

At block 1042c, the circuit finds a non-CMS difference between (1) a product between the last one of the plurality of image signals and a sum of a plurality of non-CMS weights and (2) a sum of a plurality of non-CMS products between each of the reset signals and each of the non-CMS weights. The circuit can then apply a random LSB dither at block 1044 one or more times, or proceed directly to block 1046c in which the circuit finds a quotient between the non-CMS difference and the sum of the plurality of non-CMS weights. For example, if m=4 and the weights are $a_1$, $a_2$, $a_3$, and $a_4$, the output can be $(S4*(a_1+a_2+a_3+a_4)-(a_4*R4+a_3*R3+a_2*R2+a_1*R1))/(a_1+a_2+a_3+a_4)=S4-(a_4*R4+a_3*R3+a_2*R2+a_1*R1))/(a_1+a_2+a_3+a_4)$.

In other embodiments, the non-CMS calculations can be performed in different arithmetic sequences. For example, the reset signals can be added together one-by-one (e.g., R1, R1+R2, R1+R2+R3, R1+R2+R3+R4), then the sum of the reset signals can be flipped to its negative value (e.g., −(R1+R2+R3+R4)), then the image signal can be added to match the number of reset signals (e.g., S1−(R1+R2+R3+R4), S1+S1−(R1+R2+R3+R4), S1+S1+S1−(R1+R2+R3+R4), S1+S1+S1+S1−(R1+R2+R3+R4)), then the result can be divided by the number of image-reset signal pairs (e.g., (S1+S1+S1+S1−(R1+R2+R3+R4))/4).

The above description of illustrated examples of the disclosure, including what is described in the Abstract, is not intended to be exhaustive or to limit the disclosure to the precise forms disclosed. While specific examples of the disclosure are described herein for illustrative purposes, various modifications are possible within the scope of the disclosure, as those skilled in the relevant art will recognize.

These modifications can be made to the disclosure in light of the above detailed description. The terms used in the following claims should not be construed to limit the disclosure to the specific examples disclosed in the specification. Rather, the scope of the disclosure is to be determined entirely by the following claims, which are to be construed in accordance with established doctrines of claim interpretation.

What is claimed is:

1. A readout circuit for use in an image sensor, comprising:
    a comparator having a first input coupled to receive a ramp signal from a ramp generator and a second input coupled to receive an analog image data signal from one of a plurality of bitlines, wherein the comparator is configured to generate a comparator output in response to a comparison of the ramp signal and the analog image data signal;
    a sampling circuit having a first input coupled to receive a sampling control signal and a second input coupled to receive the comparator output, wherein the sampling circuit is configured to generate a sampling output; and
    a counter having a first input coupled to receive a counter control signal and a second input coupled to receive one of the comparator output and a signal from the sampling circuit, wherein the counter is configured to generate a count code,
    wherein the readout circuit is configured to perform correlated multiple sampling (CMS) calculations or non-CMS calculations in response to the sampling output.

2. The readout circuit of claim 1, wherein the sampling circuit comprises:
    a latch having a first input coupled to receive the sampling control signal and a second input coupled to receive the comparator output, wherein the latch is configured to generate the sampling output, and
    wherein the second input of the counter is coupled to receive the comparator output.

3. The readout circuit of claim 2, wherein the sampling output is equal to the comparator output while the sampling control signal is high, wherein the sampling circuit is configured to latch the comparator output in response to a falling edge of the sampling control signal, and wherein the sampling output remains equal to the comparator output latched in the sampling circuit after the falling edge of the sampling control signal.

4. The readout circuit of claim 1, wherein the sampling control signal is a first sampling control signal, wherein the sampling circuit comprises:
    a first latch having a first input coupled to receive the first sampling control signal and a second input coupled to receive the comparator output, wherein the first latch is configured to generate a latch output; and
    a second latch having a first input coupled to receive a second sampling control signal and a second input coupled to receive the latch output, wherein the second latch is configured to generate the sampling output, and
    wherein the second input of the counter is coupled to receive the latch output.

5. The readout circuit of claim 4, wherein the latch output is equal to the comparator output while the first sampling control signal is high, wherein the first latch is configured to latch the comparator output in response to a falling edge of the first sampling control signal, wherein the latch output remains equal to the comparator output after the falling edge of the first sampling control signal, wherein the sampling output is equal to the latch output while the second sampling control signal is high, wherein the second latch is configured to latch the latch output in response to a falling edge of the second sampling control signal, and wherein the sampling output remains equal to the latch output latched in the second latch after the falling edge of the second sampling control signal.

6. The readout circuit of claim 1, wherein the sampling circuit comprises:
    an AND gate having a first input coupled to receive the sampling control signal and a second input, wherein the AND gate is configured to generate an AND gate output;
    a flip flop having a first input coupled to receive the AND gate output and a second input coupled to receive the comparator output, wherein the flip flop is configured to generate the sampling output; and
    an inverter coupled to receive the sampling output, wherein the inverter is configured to generate an inverter output, and wherein the second input of the AND gate is coupled to receive the inverter output, and
    wherein the second input of the counter is coupled to receive the comparator output.

7. The readout circuit of claim 6, wherein the sampling output is equal to the comparator output while the AND gate output is high, wherein the flip flop is configured to latch the comparator output in response to a falling edge of the AND gate output, and wherein the sampling output remains equal to the comparator output latched in the flip flop after the falling edge of the AND gate output while the AND gate output is low.

8. The readout circuit of claim 6, wherein the flip flop has a third input coupled to receive a reset signal, and wherein the counter has a third input coupled to receive the sampling output.

9. A method of operating an image sensor, comprising:
    comparing a ramp signal from a ramp generator and an analog image data signal from one of a plurality of bitlines to generate a comparator output;

sampling the comparator output with a sampling circuit in response to a sampling control signal to generate a sampling output;

generating a counter code with a counter circuit in response to a counter control signal and one of the comparator output and a signal from the sampling circuit;

reading out a plurality of reset signals during a plurality of reset signal readout periods;

reading out a plurality of image signals during a plurality of image signal readout periods; and determining whether correlated multiple sampling (CMS) calculations or non-CMS calculations are performed in response to the sampling output.

10. The method of claim 9, wherein the sampling circuit comprises:

a latch having a first input coupled to receive the sampling control signal and a second input coupled to receive the comparator output, wherein the latch is configured to generate the sampling output, and wherein the second input of the counter is coupled to receive the comparator output.

11. The method of claim 10, further comprising:

configuring the sampling control signal to be high during a first one of the plurality of image signal readout periods, and low otherwise; and configuring the counter control signal to be high during the plurality of reset signal readout periods, the plurality of image signal readout periods, and a period immediately after the first one of the plurality of image signal readout periods, and low otherwise.

12. The method of claim 9, wherein the sampling control signal is a first sampling control signal, wherein the sampling circuit comprises:

a first latch having a first input coupled to receive the first sampling control signal and a second input coupled to receive the comparator output, wherein the first latch is configured to generate a latch output; and a second latch having a first input coupled to receive a second sampling control signal and a second input coupled to receive the latch output, wherein the second latch is configured to generate the sampling output, and wherein the second input of the counter is coupled to receive the latch output.

13. The method of claim 12, further comprising:

configuring the first sampling control signal to be high during the plurality of reset signal readout periods and the plurality of image signal readout periods, and low otherwise;

configuring the second sampling control signal to be high between a first one and a second one of the plurality of image signal readout periods, and low otherwise; and configuring the counter control signal to be high during the plurality of reset signal readout periods, the plurality of image signal readout periods, and a period immediately after the first one of the plurality of image signal readout periods, and low otherwise.

14. The method of claim 9, wherein the sampling circuit comprises:

an AND gate having a first input coupled to receive the sampling control signal and a second input, wherein the AND gate is configured to generate an AND gate output;

a flip flop having a first input coupled to receive the AND gate output and a second input coupled to receive the comparator output, wherein the flip flop is configured to generate the sampling output; and an inverter coupled to receive the sampling output, wherein the inverter is configured to generate an inverter output, and wherein the second input of the AND gate is coupled to receive the inverter output, and wherein the second input of the counter is coupled to receive the comparator output.

15. The method of claim 14, further comprising:

configuring the sampling control signal to be high during the plurality of image signal readout periods except a last one of the plurality of image signal readout periods, and low otherwise; and configuring the counter control signal to be high during the plurality of reset signal readout periods and the plurality of image signal readout periods, and low otherwise.

16. A method of performing adaptive correlated multiple sampling (CMS), comprising:

reading out a plurality of reset signals and a plurality of image signals;

performing CMS calculations for small signals, including:

finding a plurality of CMS differences, wherein each CMS difference is between one of the image signals and a corresponding one of the reset signals;

finding a plurality of CMS products, wherein each CMS product is between one of the CMS differences and one of a plurality of CMS weights, wherein a sum of the CMS weights is 1; and finding a sum of the CMS products;

performing non-CMS calculations for large signals, including:

finding a non-CMS difference between a representative image signal and a representative reset signal, wherein the representative image signal is based on only a last one of the image signals; and finding a quotient between the non-CMS difference and a divisor.

17. The method of claim 16, wherein when performing the CMS calculations:

each of the CMS weights is equal to a multiplicative inverse of a number of image signals.

18. The method of claim 16, wherein when performing the CMS calculations:

a first one of the CMS differences is a difference between a first one of the image signals and a last one of the reset signals;

a last one of the CMS differences is a difference between a last one of the image signals and a first one of the reset signals; and a first one of the CMS weights multiplied with the first one of the CMS differences is greater than a last one of the weights multiplied with the last one of the CMS differences.

19. The method of claim 16, wherein when performing the non-CMS calculations:

the representative image signals is the last one of the image signals;

the representative reset signal is one of the reset signals; and the divisor is 1.

20. The method of claim 16, wherein when performing the non-CMS calculations:

the representative image signals is a product between the last one of the image signals and a number of the reset signals;

the representative reset signal is a sum of the reset signals; and the divisor is the number of the reset signals.

21. The method of claim 16, wherein when performing the non-CMS calculations:
    the representative image signals is a product between the last one of the plurality of image signals and a sum of a plurality of non-CMS weights;
    the representative reset signal is a sum of a plurality of non-CMS products, wherein each of the non-CMS products is a product between each of the reset signals and each of the non-CMS weights; and
    the divisor is the sum of the non-CMS weights.

22. The method of claim 16, wherein when performing the non-CMS calculations:
    the one of the non-CMS weights multiplied with a first one of the reset signals is greater than the one of the non-CMS weights multiplied with a last one of the reset signals.

23. The method of claim 22, wherein performing the non-CMS calculations further includes:
    applying a random least significant bit (LSB) dither prior to finding the quotient.

24. The method of claim 16, wherein the method is performed by a readout circuit of an imaging device.

25. The method of claim 16, wherein the CMS calculations and the non-CMS calculations are performed by a logic circuit external to a readout circuit of an imaging device.

* * * * *